(12) United States Patent
Lu et al.

(10) Patent No.: US 8,102,669 B2
(45) Date of Patent: Jan. 24, 2012

(54) CHIP PACKAGE STRUCTURE WITH SHIELDING COVER

(75) Inventors: Hsin-Chieh Lu, Kaohsiung (TW); Chin-Feng Chou, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 413 days.

(21) Appl. No.: 12/511,288

(22) Filed: Jul. 29, 2009

(65) Prior Publication Data

US 2010/0085719 A1 Apr. 8, 2010

(30) Foreign Application Priority Data

Oct. 7, 2008 (TW) .............................. 97138564 A

(51) Int. Cl.
*H05K 7/00* (2006.01)
*H05K 9/00* (2006.01)

(52) U.S. Cl. ........................................ 361/782; 361/816

(58) Field of Classification Search .................. 361/760, 361/736, 720, 816, 818, 803, 782; 257/659; 174/376, 377, 378, 379, 380, 381, 382, 383, 174/384, 385, 386, 387
See application file for complete search history.

(56) References Cited

U.S. PATENT DOCUMENTS

| | | | | |
|---|---|---|---|---|
| 5,099,396 A * | 3/1992 | Barz et al. | ..................... | 361/818 |
| 5,166,864 A * | 11/1992 | Chitwood et al. | ............ | 361/720 |
| 6,016,084 A * | 1/2000 | Sugimoto | ....................... | 333/12 |
| 6,335,669 B1 * | 1/2002 | Miyazaki et al. | ............. | 333/247 |
| 6,377,464 B1 * | 4/2002 | Hashemi et al. | ............... | 361/760 |
| 6,667,480 B2 * | 12/2003 | Kajiwara et al. | ......... | 250/370.01 |
| 6,770,956 B2 * | 8/2004 | Fujimoto et al. | .............. | 257/659 |
| 6,885,561 B1 * | 4/2005 | Hashemi et al. | ............... | 361/760 |
| 7,436,672 B2 * | 10/2008 | Ushijima et al. | .............. | 361/715 |
| 7,557,307 B2 * | 7/2009 | Nishizawa et al. | ........... | 174/384 |
| 7,564,121 B2 * | 7/2009 | Sugimoto | ....................... | 257/659 |
| 7,772,046 B2 * | 8/2010 | Pagaila et al. | ................. | 438/127 |
| 2006/0076658 A1 * | 4/2006 | Wu | ............................... | 257/678 |
| 2007/0164406 A1 * | 7/2007 | Tseng | ........................... | 257/666 |
| 2007/0215993 A1 * | 9/2007 | Chen | ............................ | 257/675 |
| 2008/0036077 A1 * | 2/2008 | Wang | ............................ | 257/717 |
| 2008/0158844 A1 * | 7/2008 | Kim | ............................... | 361/809 |
| 2009/0002967 A1 * | 1/2009 | Asami | .......................... | 361/816 |
| 2009/0184405 A1 * | 7/2009 | Lu | .................................. | 257/660 |
| 2009/0294928 A1 * | 12/2009 | Kim et al. | ..................... | 257/659 |
| 2009/0302436 A1 * | 12/2009 | Kim et al. | ..................... | 257/659 |

* cited by examiner

*Primary Examiner* — Lisa Lea Edmonds
*Assistant Examiner* — Xanthia C Cunningham
(74) *Attorney, Agent, or Firm* — J.C. Patents

(57) ABSTRACT

A chip package structure with a shielding cover includes a substrate, a chip, a pair of first passive components, a pair of second passive components, and a shielding cover. The chip, the pair of first passive components, the pair of second passive components, and the shielding cover are disposed on the substrate. The chip is electrically connected to the substrate. The shielding cover covers the chip and has leads connected to the substrate. The leads include a first lead and a second lead. The first lead connected to a portion of the substrate is located between the pair of first passive components and arranged along a first axis with the pair of first passive components. The second lead connected to a portion of the substrate is located between the pair of second passive components and arranged along a second axis with the pair of second passive components.

11 Claims, 3 Drawing Sheets

CHIP PACKAGE STRUCTURE WITH SHIELDING COVER

CROSS-REFERENCE TO RELATED APPLICATION

This application claims the priority benefit of Taiwan application serial no. 97138564, filed Oct. 7, 2008. The entirety of the above-mentioned patent application is hereby incorporated by reference herein and made a part of specification.

BACKGROUND OF THE INVENTION

1. Field of the Invention

The present invention relates to a chip package structure, and more particularly to a chip package structure with a shielding cover.

2. Description of Related Art

An integrated circuit (IC) chip is often electrically connected to a motherboard through a circuit board, so as to allow electronic signals to be transmitted between the IC chip and the motherboard. Nevertheless, the higher a clock frequency of the IC chip is, the easier the electronic signals suffer from electromagnetic interference (EMI). In order to prevent stability of the IC chip from being affected by EMI, a metal cover is frequently disposed on top of the circuit board for avoiding electromagnetic wave leakage or precluding the circuit board from being interfered by an external electromagnetic wave.

At present, the metal cover can be disposed on the circuit board by applying a pin through hole (PTH) technique or a surface mount technology (SMT). In the conventional SMT, conductive paste or solder paste are printed (inkjet printed or screen printed) on the back of the circuit board, and thereby ends of leads of the metal cover are directly bonded to pads on the circuit board by means of the conductive paste and or the solder paste. Nonetheless, in a process of baking and solidifying the conductive paste or in a reflow process for transforming the solder paste to be in a liquid form, heat convection generated thereby results in shift and deflection of the metal cover. As a result, the metal cover disposed on the circuit board cannot be accurately positioned on the pads of the circuit board, and yield of assembling the metal cover is negatively affected.

SUMMARY OF THE INVENTION

The present invention is directed to a chip package structure with a shielding cover for improving yield of assembling the shielding cover.

In the present invention, a chip package structure with a shielding cover is provided. The chip package structure includes a substrate, a chip, a pair of first passive components, a pair of second passive components, and a shielding cover. The chip is disposed on and electrically connected to the substrate. The pair of first passive components is disposed on the substrate. The pair of second passive components is also disposed on the substrate. The shielding cover is disposed on the substrate and covers the chip. Here, the shielding cover has a plurality of leads connected to the substrate. The leads include a first lead and a second lead. The first lead connected to a portion of the substrate is located between the pair of first passive components and arranged along a first axis with the pair of first passive components. The second lead connected to a portion of the substrate is located between the pair of second passive components and arranged along a second axis with the pair of second passive components.

In one embodiment of the present invention, the pair of first passive components, the pair of second passive components, the first lead, and the second lead are electrically connected to the substrate through a conductive material.

In one embodiment of the present invention, the conductive material includes conductive paste or solder paste.

In one embodiment of the present invention, the substrate has a rectangular shape.

In one embodiment of the present invention, the first lead and the pair of first passive components are arranged along the first axis, and the second lead and the pair of second passive components are arranged along the second axis. The first axis is substantially perpendicular to the second axis.

In one embodiment of the present invention, the substrate further includes a pair of third passive components and a pair of fourth passive components, and the leads further include a third lead and a fourth lead. The pair of third passive components and the pair of first passive components are respectively located at two opposite diagonal corners of the substrate. The pair of fourth passive components and the pair of second passive components are respectively located at the other two opposite diagonal corners of the substrate. The third lead connected to a portion of the substrate is located between the pair of third passive components and arranged, together with the pair of third passive components, along an axis substantially parallel to the first axis. The fourth lead connected to a portion of the substrate is located between the pair of fourth passive components and arranged, together with the pair of fourth passive components, along an axis substantially parallel to the second axis.

In one embodiment of the present invention, the pair of first passive components, the pair of second passive components, the pair of third passive components, the pair of fourth passive components, the first lead, the second lead, the third lead, and the fourth lead are electrically connected to the substrate through a conductive material.

In one embodiment of the present invention, the conductive material includes conductive paste or solder paste.

In one embodiment of the present invention, the substrate further includes a pair of third passive components and a pair of fourth passive components, and the leads further include a third lead and a fourth lead. The pair of third passive components and the pair of first passive components are respectively disposed at two opposite sides with respect to the center of gravity of the substrate. The pair of fourth passive components and the pair of second passive components are respectively disposed at the other two opposite sides with respect to the center of gravity of the substrate. The third lead connected to a portion of the substrate is located between the pair of third passive components and arranged, together with the pair of third passive components, along an axis substantially parallel to the first axis. The fourth lead connected to a portion of the substrate is located between the pair of fourth passive components and arranged, together with the pair of fourth passive components, along an axis substantially parallel to the second axis.

In one embodiment of the present invention, the shielding cover includes a top wall and a side wall perpendicularly connected to edges of the top wall.

In one embodiment of the present invention, each of the leads includes a leg and a base. One end of the leg is connected to an edge of the top wall. The other end of the leg is connected to one end of the base. A surface of the base is connected to a portion of the substrate. An extending direction of the base is substantially parallel to an extending direction of the top wall.

Based on the above, in the chip package structure, the leads connected to the portions of the substrate of the shielding cover are respectively located between the pairs of passive components according to the present invention. Namely, an interval between each pair of passive components limits the moving distance of each of the leads of the shielding cover. Hence, in comparison with the related art, the present invention is capable of preventing the shielding cover from being shifted and deflected due to heat convection occurring in the process of heating the conductive material. Moreover, yield of assembling the shielding cover can be further improved.

In order to make the above and other features and advantages of the present invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
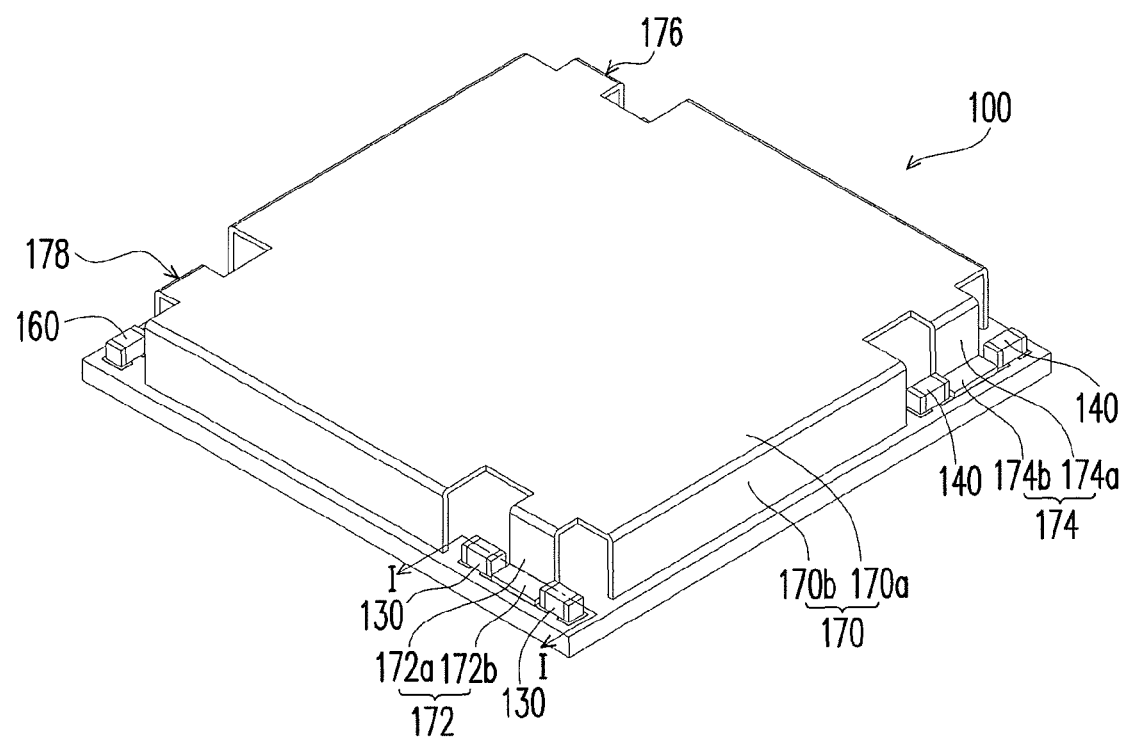
FIG. 1 is a schematic three-dimensional view of a chip package structure with a shielding cover according to an embodiment of the present invention.
Figure 2:
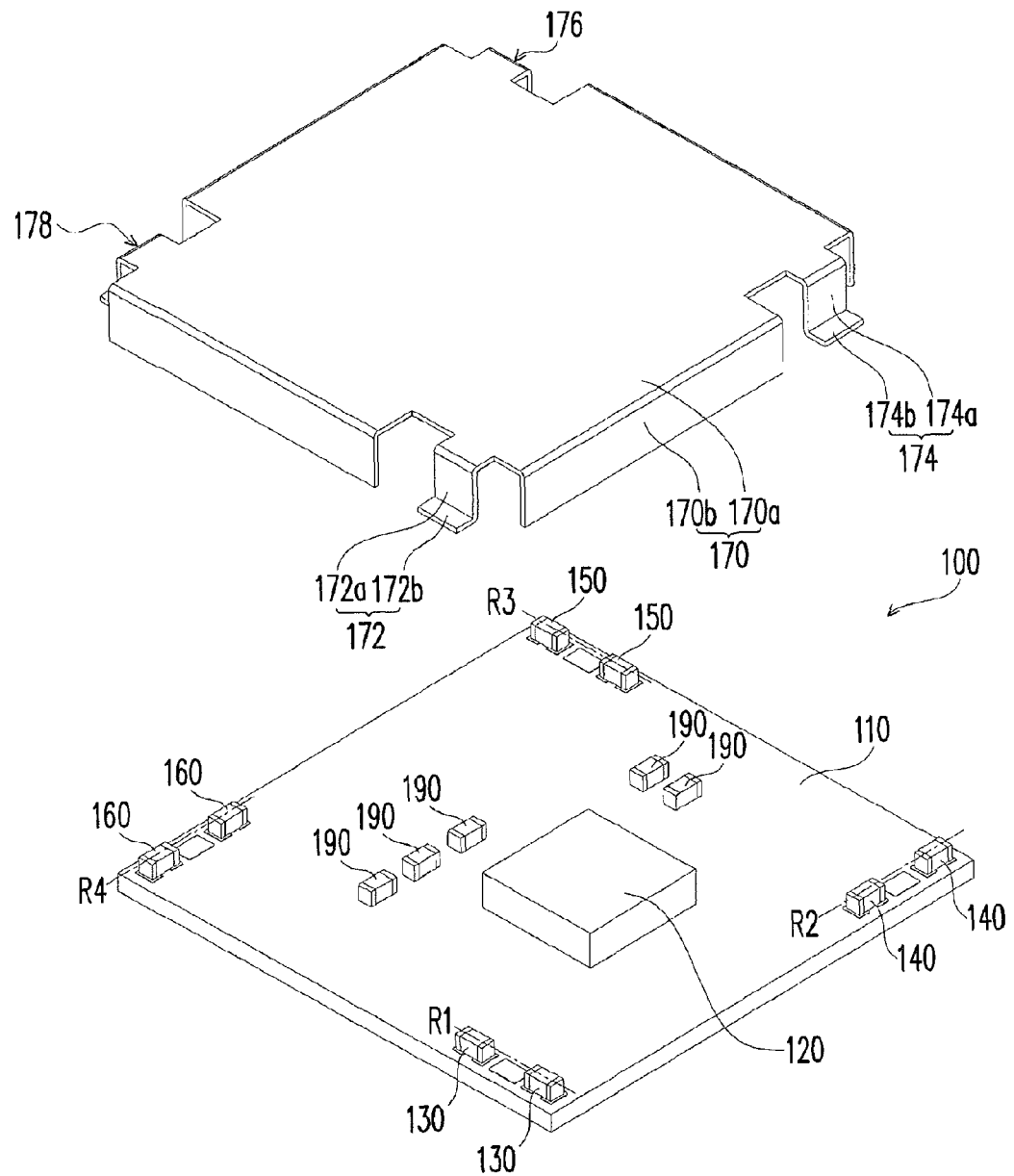
FIG. 2 is a schematic three-dimensional exploded view of the chip package structure with the shielding cover as depicted in FIG. 1.
Figure 3:
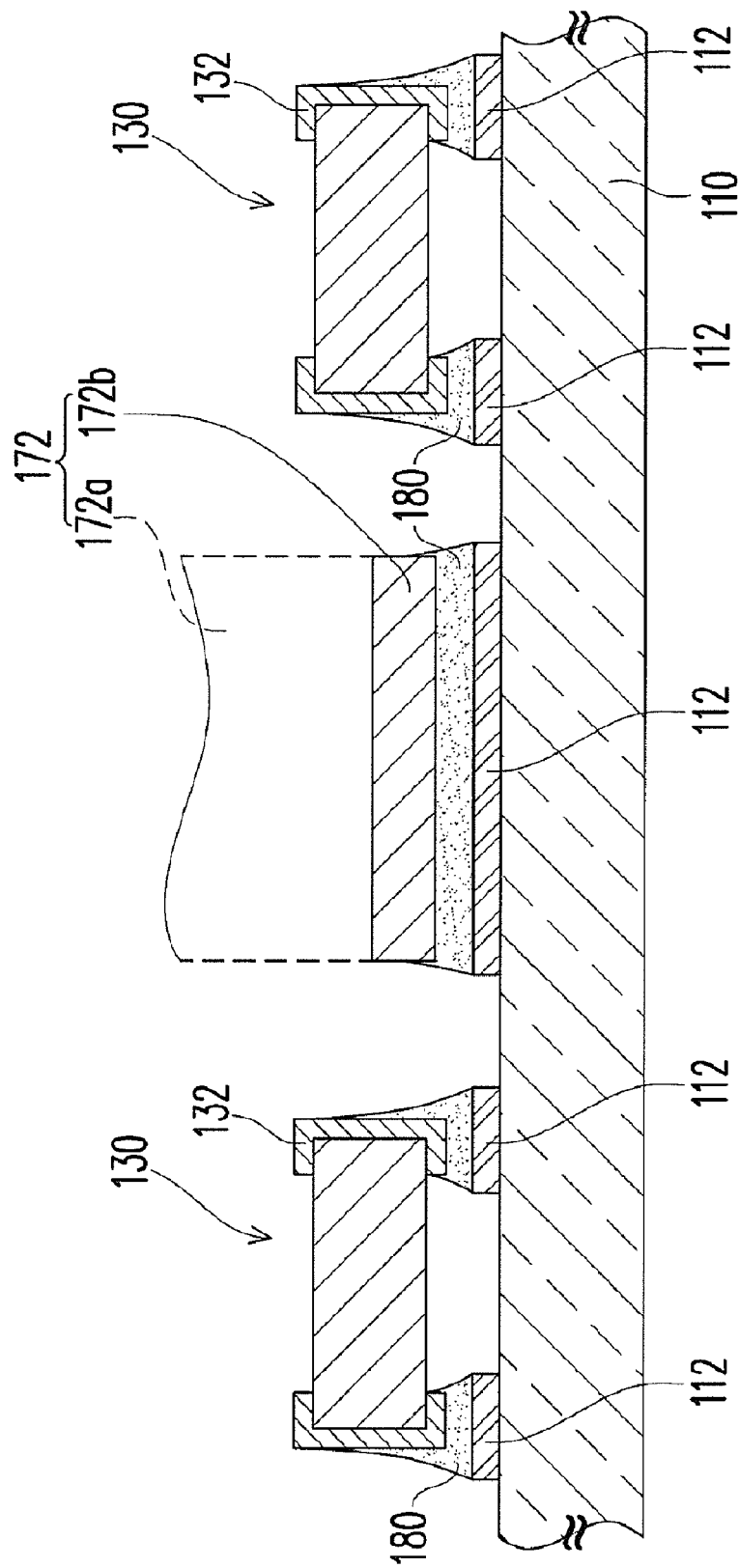
FIG. 3 is a cross-sectional view which is taken along a line I-I and illustrates the chip package structure with the shielding cover as depicted in FIG. 1.

FIG. 1 is a schematic three-dimensional view of a chip package structure with a shielding cover according to an embodiment of the present invention. FIG. 2 is a schematic three-dimensional exploded view of the chip package structure with the shielding cover as depicted in FIG. 1. FIG. 3 is a cross-sectional view which is taken along a line I-I and illustrates the chip package structure with the shielding cover as depicted in FIG. 1. Referring to FIGS. 1 and 2, in the present embodiment, a chip package structure 100 includes a substrate 110, a chip 120, a pair of first passive components 130, a pair of second passive components 140, and a shielding cover 170. According to the present embodiment, the substrate 110 is, for example, a printed circuit board (PCB), a module board, or a package substrate.

Specifically, the chip 120 is disposed on the substrate 110. Besides, the chip 120 can be electrically connected to the substrate 110 through a plurality of conductive bumps (not shown) disposed below the chip 120, such that signals can be transmitted through the conductive bumps between two interfaces of the chip 120 and the substrate 110, two components thereof, or two ends thereof. In the present embodiment, a plurality of capacitors 190 is disposed around the chip 120. Particularly, in order to meet demands on electrical designs, the capacitors 190 are disposed on the substrate 110.

The pair of first passive components 130 is disposed on the substrate 110. Besides, the pair of first passive components 130 is, for example, a pair of capacitors respectively including a pair of electrodes 132 as shown in FIG. 3. In the present embodiment, the pair of second passive components 140 is disposed on the substrate 110. The structure of the pair of second passive components 140 is substantially identical to that of the pair of first passive component 130. That is to say, the pair of second passive components 140 is a pair of capacitors, for example.

The shielding cover 170 is disposed on the substrate 110 and covers the chip 120. In addition, the shielding cover 170 includes a top wall 170a and a side wall 170b perpendicularly connected to edges of the top wall 170a. The shielding cover 170 has a plurality of leads including a first lead 172 and a second lead 174. The first lead 172 includes a leg 172a and a base 172b. One end of the leg 172a is connected to an edge of the top wall 170a, and the other end of the leg 172a is connected to one end of the base 172b. A surface of the base 172b is connected to a portion of the substrate 110, and an extending direction of the base 172b is substantially parallel to an extending direction of the top wall 170a. According to the present embodiment, the structure of the second lead 174 is substantially identical to that of the first lead 172. Namely, the second lead 174 also has a leg 174a and a base 174b.

As provided above, in the present embodiment, the first lead 172 connected to a portion of the substrate 110 is located between the pair of first passive components 130 and arranged along a first axis R1 with the pair of first passive components 130. In other words, the pair of first passive components 130 restricts a moving distance of the first lead 172 on the first axis R1. The second lead 174 connected to a portion of the substrate 110 is located between the pair of second passive components 140 and arranged, together with the pair of second passive components 140, along a second axis R2 substantially not parallel to the first axis R1. Note that the second lead 174 and the pair of second passive components 140 are arranged along the second axis R2 substantially perpendicular to the first axis R1 in the present embodiment. Namely, the pair of second passive components 140 restricts a moving distance of the second lead 174 on the second axis R2. In brief, the pair of first passive components 130 and the pair of second passive components 140 can restrict movement of the shielding cover 170 on a plane (including the X direction and the Y direction).

Additionally, in the present embodiment, the substrate 110 further includes a pair of third passive components 150 and a pair of fourth passive components 160, and the leads further include a third lead 176 and a fourth lead 178. In particular, according to the present embodiment, the substrate 110 has a rectangular shape, for example. The pair of third passive components 150 and the pair of first passive components 130 are respectively located at two opposite diagonal corners of the substrate 110. The pair of fourth passive components 160 and the pair of second passive components 140 are respectively located at the other two opposite diagonal corners of the substrate 110. That is to say, the pair of first passive components 130, the pair of second passive components 140, the pair of third passive components 150, and the pair of fourth passive components 160 are respectively located at four corners of the substrate 110. In the present embodiment, the structures of the third passive components 150 and the fourth passive components 160 are substantially identical to those of the first passive components 130 and the second passive components 140. Namely, the pair of third passive components 150 and the pair of fourth passive components 160 are also respectively a pair of capacitors, for example.

As stated above, the third lead 176 connected to a portion of the substrate 110 is located between the pair of third passive components 150 and arranged, together with the pair of third passive components 150, along a third axis R3 substantially parallel to the first axis R1. Namely, the pair of third passive components 150 restricts a moving distance of the third lead 176 on the third axis R3. The fourth lead 178 connected to a portion of the substrate 110 is located between the pair of fourth passive components 160 and arranged, together with the pair of fourth passive components 160, along a fourth axis R4 substantially parallel to the second axis R2. Namely, the pair of fourth passive components 160 restricts a moving distance of the fourth lead 178 on the fourth axis R4. According to the present embodiment, the structures of the third lead 176 and the fourth lead 178 are substantially identical to those of the first lead 172 and the second lead 174. That is to say, the third lead 176 and the fourth lead 178 respectively have a leg (not shown) and a base (not shown) as well.

On the other hand, referring to FIGS. 2 and 3, the pair of first passive components 130, the pair of second passive components 140, the pair of third passive components 150, the pair of fourth passive components 160, the first lead 172, the second lead 174, the third lead 176, and the fourth lead 178 are electrically connected to the substrate 110 through a conductive material 180 according to the present embodiment. Here, the conductive material 180 includes conductive paste or solder paste. Since the pair of first passive components 130, the pair of second passive components 140, the pair of third passive components 150, the pair of fourth passive components 160, the first lead 172, the second lead 174, the third lead 176, and the fourth lead 178 are electrically connected to the substrate 110 in the same manner, it should be mentioned that only the pair of first passive components 130 and the first lead 172 are schematically depicted in FIG. 3 for the purpose of illustration.

Particularly, before the pair of first passive components 130, the pair of second passive components 140, the pair of third passive components 150, and the pair of fourth passive components 160 are disposed on the substrate 110, the conductive material 180 is printed (screen printed or inkjet printed) on pads 112 of the substrate 110. Thereafter, a first heating process is performed, so as to transform the conductive material 180 to be in a liquid form. Next, the pair of first passive components 130, the pair of second passive components 140, the pair of third passive components 150, and the pair of fourth passive components 160 are disposed on the pads 112 of the substrate 110. As the conductive material 180 in the liquid form is cooled down and solidified, the pair of first passive components 130, the pair of second passive components 140, the pair of third passive components 150, and the pair of fourth passive components 160 are bonded to the substrate 110 by means of the solidified conductive material 180. In other words, the pair of first passive components 130, the pair of second passive components 140, the pair of third passive components 150, and the pair of fourth passive components 160 are electrically connected to the substrate 110 through the conductive material 180.

After that, the first lead 172, the second lead 174, the third lead 176, and the fourth lead 178 are respectively inserted between the pair of first passive components 130, the pair of second passive components 140, the pair of third passive components 150, and the pair of fourth passive components 160. Finally, a second heating process is implemented, so as to bond the shielding cover 170 onto the substrate 110. It should be mentioned that the first and second heating processes refer to a baking process when the conductive material 180 is the conductive paste. By contrast, when the conductive material 180 is the solder paste, the first and second heating processes refer to a reflow process.

The pair of first passive components 130, the pair of second passive components 140, the pair of third passive components 150, and the pair of fourth passive components 160 respectively restrict moving distances of the first lead 172, the second lead 174, the third lead 176, and the fourth lead 178 sequentially on the first axis R1, the second axis R2, the third axis R3, and the fourth axis R4. Besides, the first axis R1 is substantially parallel to the third axis R3, the second axis R2 is substantially parallel to the fourth axis R4, and the first axis R1 is substantially perpendicular to the second axis R2. Therefore, during the implementation of the second heating process, the pair of first passive components 130, the pair of second passive components 140, the pair of third passive components 150, and the pair of fourth passive components 160 can restrict the movements of the first lead 172, the second lead 174, the third lead 176, and the fourth lead 178 on a plane (including the X direction and the Y direction).

In brief, the pair of first passive components 130, the pair of second passive components 140, the pair of third passive components 150, and the pair of fourth passive components 160 can restrict the moving distances of the first lead 172, the second lead 174, the third lead 176, and the fourth lead 178 of the shielding cover 170 according to the present embodiment. Hence, when the conductive material 180 is heated and transformed to be in the liquid form, shift and deflection of the shielding cover 170 caused by heat convection can be prevented, and yield of assembling the shielding cover 170 can be further improved.

Note that in the embodiment depicted in FIGS. 1 and 2, the chip package structure 100 includes the pair of first passive components 130, the pair of second passive components 140, the pair of third passive components 150, and the pair of fourth passive components 160. However, in other embodiments that are not depicted, the chip package structure 100 can merely include the pair of first passive components 130 and the pair of second passive components 140, and the movements of the first lead 172 and the second lead 174 can still be restricted on a plane. Therefore, the number of the paired passive components as shown in FIGS. 1 and 2 merely serves as an example of but not a limitation to the present invention.

On the other hand, in the embodiment shown in FIGS. 1 and 2, the substrate 110 has a rectangular shape, and the first axis R1 is substantially perpendicular to the second axis R2. However, in other embodiments not shown in the drawings, the substrate 110 can also have a polygonal shape or a round shape, and the first axis R1 may not be parallel to the second axis R2. As long as the pair of third passive components 150 and the pair of first passive components 130 are respectively located at two opposite sides with respect to the center of gravity of the substrate 110, and the pair of fourth passive components 160 and the pair of second passive components 140 are respectively located at the other two opposite sides with respect to the center of gravity of the substrate 110, the movements of the first lead 172, the second lead 174, the third lead 176, and the fourth lead 178 can be restricted to be on a plane. Accordingly, the shape of the substrate depicted in FIGS. 1 and 2 merely serves as an example of but not a limitation to the present invention.

Based on the foregoing, in the chip package structure of the present invention, the first lead, the second lead, the third lead, and the fourth lead connected to the portions of the substrate are respectively located between the pair of first passive components, the pair of second passive components, the pair of third passive components, and the pair of fourth passive components. Namely, an interval between each pair of passive components limits the moving distance of each of the leads of the shielding cover. Moreover, the first axis is substantially perpendicular to the second axis. Thus, when the conductive material is heated and transformed to be in the liquid form, the pair of first passive components, the pair of second passive components, the pair of third passive components, and the pair of fourth passive components can restrict the movements of the first lead, the second lead, the third lead, and the fourth lead on a plane (including the X direction and the Y direction). As a result, shift and deflection of the shielding cover caused by heat convection during the heating process can be prevented, and yield of assembling the shielding cover can also be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure with a shielding cover, comprising:
    a substrate;
    a chip, disposed on and electrically connected to the substrate;
    a pair of first passive components, disposed on the substrate;
    a pair of second passive components, disposed on the substrate; and
    a shielding cover, disposed on the substrate and covering the chip, the shielding cover having a plurality of leads connected to the substrate, the leads including a first lead and a second lead, wherein the first lead connected to a portion of the substrate is located between the pair of first passive components and arranged along a first axis with the pair of first passive components, and the second lead connected to a portion of the substrate is located between the pair of second passive components and arranged along a second axis with the pair of second passive components.

2. The chip package structure with the shielding cover as claimed in claim 1, wherein the pair of first passive components, the pair of second passive components, the first lead, and the second lead are electrically connected to the substrate through a conductive material.

3. The chip package structure with the shielding cover as claimed in claim 2, wherein the conductive material comprises conductive paste or solder paste.

4. The chip package structure with the shielding cover as claimed in claim 1, wherein the substrate has a rectangular shape.

5. The chip package structure with the shielding cover as claimed in claim 4, wherein the first lead and the pair of first passive components are arranged along the first axis, the second lead and the pair of second passive components are arranged along the second axis, and the first axis is substantially perpendicular to the second axis.

6. The chip package structure with the shielding cover as claimed in claim 5, the substrate further comprising a pair of third passive components and a pair of fourth passive components, the leads further comprising a third lead and a fourth lead, the pair of third passive components and the pair of first passive components being respectively located at two opposite diagonal corners of the substrate, the pair of fourth passive components and the pair of second passive components being respectively located at the other two opposite diagonal corners of the substrate, wherein the third lead connected to a portion of the substrate is located between the pair of third passive components and arranged, together with the pair of third passive components, along an axis substantially parallel to the first axis, the fourth lead connected to a portion of the substrate is located between the pair of fourth passive components and arranged, together with the pair of fourth passive components, along an axis substantially parallel to the second axis.

7. The chip package structure with the shielding cover as claimed in claim 6, wherein the pair of first passive components, the pair of second passive components, the pair of third passive components, the pair of fourth passive components, the first lead, the second lead, the third lead, and the fourth lead are electrically connected to the substrate through a conductive material.

8. The chip package structure with the shielding cover as claimed in claim 7, wherein the conductive material comprises conductive paste or solder paste.

9. The chip package structure with the shielding cover as claimed in claim 1, the substrate further comprising a pair of third passive components and a pair of fourth passive components, the leads further comprising a third lead and a fourth lead, the pair of third passive components and the pair of first passive components being respectively located at two opposite sides with respect to the center of gravity of the substrate, the pair of fourth passive components and the pair of second passive components being respectively located at the other two opposite sides with respect to the center of gravity of the substrate, wherein the third lead connected to a portion of the substrate is located between the pair of third passive components and arranged, together with the pair of third passive components, along an axis substantially parallel to the first axis, the fourth lead connected to a portion of the substrate is located between the pair of fourth passive components and arranged, together with the pair of fourth passive components, along an axis substantially parallel to the second axis.

10. The chip package structure with the shielding cover as claimed in claim 1, wherein the shielding cover comprises a top wall and a side wall perpendicularly connected to edges of the top wall.

11. The chip package structure with the shielding cover as claimed in claim 10, each of the leads comprising a leg and a base, wherein an end of the leg is connected to an edge of the top wall, the other end of the leg is connected to an end of the base, a surface of the base is connected to a portion of the substrate, and an extending direction of the base is substantially parallel to an extending direction of the top wall.

* * * * *